(12) United States Patent
Buer et al.

(10) Patent No.: US 7,715,265 B2
(45) Date of Patent: May 11, 2010

(54) DIFFERENTIAL LATCH-BASED ONE TIME PROGRAMMABLE MEMORY

(75) Inventors: Myron Buer, Gilbert, AZ (US); Jonathan Schmitt, Eden Prairie, MN (US); Laurentiu Vasiliu, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 18 days.

(21) Appl. No.: 11/933,109

(22) Filed: Oct. 31, 2007

(65) Prior Publication Data
US 2009/0109724 A1    Apr. 30, 2009

(51) Int. Cl.
*G11C 17/18* (2006.01)
(52) U.S. Cl. .............. 365/225.7; 365/185.28; 365/207
(58) Field of Classification Search ............ 365/201, 365/225.7, 185.21, 185.22, 189.05, 230.08, 365/185.28, 207
See application file for complete search history.

(56) References Cited

U.S. PATENT DOCUMENTS

| | | | | |
|---|---|---|---|---|
| 5,886,937 | A * | 3/1999 | Jang | 365/203 |
| 6,392,943 | B2 * | 5/2002 | Fournel | 365/189.15 |
| 6,434,068 | B1 * | 8/2002 | Harada et al. | 365/201 |
| 6,970,371 | B1 * | 11/2005 | Summerfelt et al. | 365/145 |

* cited by examiner

*Primary Examiner*—Pho M. Luu
(74) *Attorney, Agent, or Firm*—Sterne Kessler Goldstein & Fox,. P.L.L.C.

(57) ABSTRACT

A differential latch-based one time programmable memory cell is provided. The differential latch-based one time programmable memory cell includes a differential latching amplifier having a first set of fuse devices coupled to the first input and a second set of fuse devices coupled to the second input. Only one set of fuse devices can be programmed in a memory cell. If one or more fuse devices in a set of fuse devices are programmed, the side having the programmed fuse will present a lower voltage at its input to the differential latching amplifier. Differential latching amplifier outputs a "0" or a "1" depending on the side having the programmed fuse.

21 Claims, 5 Drawing Sheets

DIFFERENTIAL LATCH-BASED ONE TIME PROGRAMMABLE MEMORY

FIELD OF THE INVENTION

The present invention relates generally to one time programmable memory cells.

BACKGROUND OF THE INVENTION

Two types of memory devices are commonly used in the field of data storage. The first type is volatile memory in which stored information is lost when power is removed. The second type is non-volatile memory in which the information is preserved after the power is removed. Non-volatile memory may be designed for multiple programming or for one-time programming. Examples of multiple programmable non-volatile memory include electrically erasable programmable read only memories (EEPROMs) and flash memory. Unlike a multiple programmable memory, a one-time programmable non-volatile memory can be programmed only once. The programming typically involves the "blowing" of a fuse element of the cell. The programming of a one-time programmable memory is irreversible.

One type of existing one-time programmable memory is a single-ended latch-based memory. In the existing single-ended latch-based memory, a latching amplifier compares a reference voltage, typically set to a percentage of the supply voltage, against a fuse with a current source. If the fuse is not programmed, the current source drives the voltage on the fuse to the supply voltage and the latching amplifier outputs a "0." If the fuse is programmed, the fuse sinks the current and the voltage level goes to ground, causing the latching amplifier to output a "1." Because the reference is a percentage of the supply voltage, the read margin of the single-ended latch-based memory cells is reduced resulting in reduced yield and manufacturability for these memory cells.

Furthermore, many modern applications require the secure storage of large amounts of data in non-volatile memories. Because of the nature of the information required in these secure applications, the ability to output a random value on power-up is critical. Because the unprogrammed output of the single-ended latch based memory cells is set to a default value, the use of these memory cells in certain secure applications may not be appropriate.

What is therefore needed is a latch-based one time programmable memory cell with increased read margin, yield, and manufacturability.

What is further needed is a secure latch-based one time programmable memory cell providing random output during power up.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers can indicate identical or functionally similar elements. Additionally, the left-most digit(s) of a reference number may identify the drawing in which the reference number first appears.

DETAILED DESCRIPTION OF THE INVENTION

1. One Time Programmable Memory Device

Figure 1:
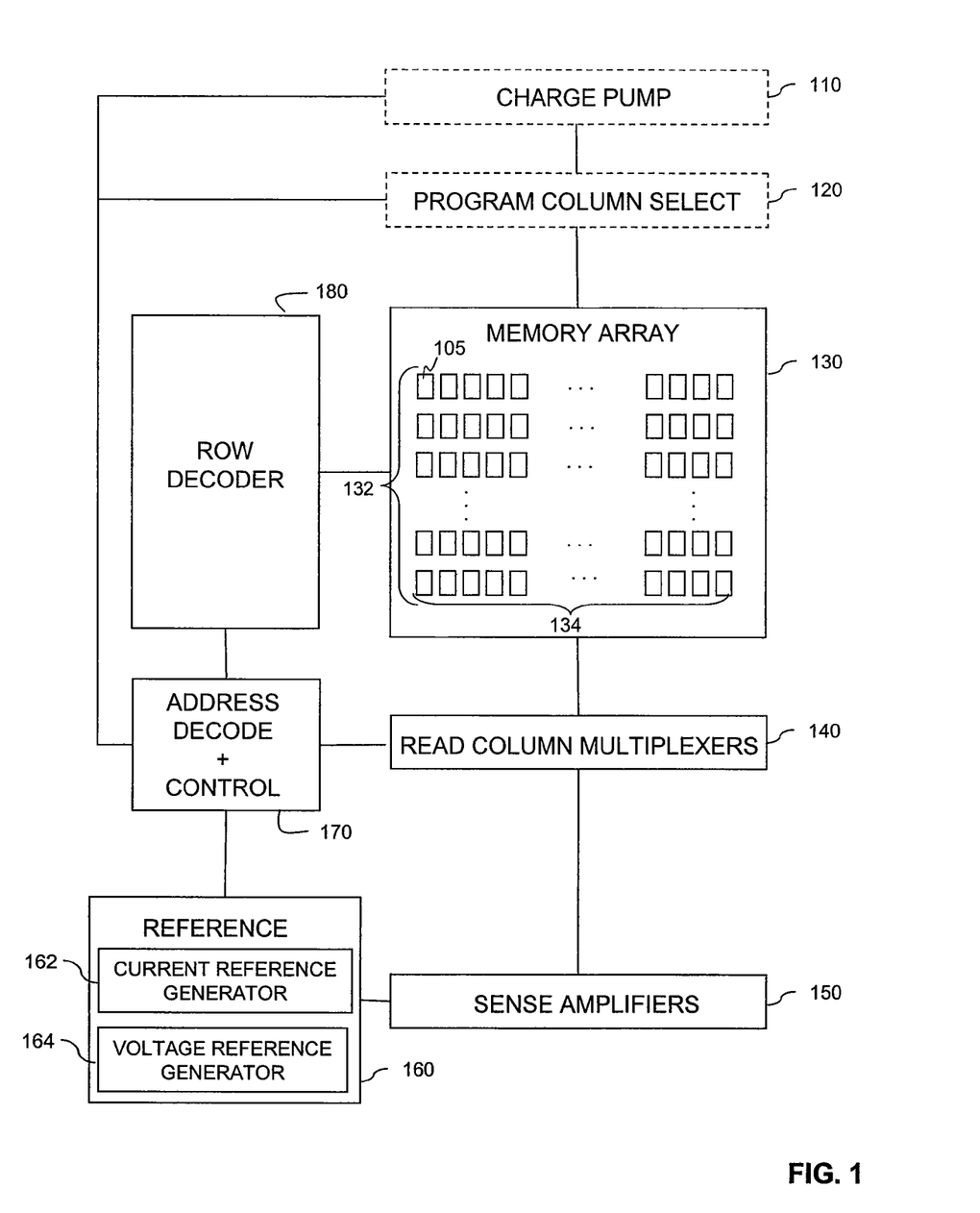
FIG. 1 depicts an exemplary one time programmable (OTP) memory device, according to embodiments of the present invention.

FIG. 1 depicts an exemplary one time programmable (OTP) memory device 100, according to embodiments of the present invention. Memory device 100 includes a memory array 130, an address decoder and control block 170, a row decoder 180, an optional program column select block 120, an optional charge pump 110, optional read column multiplexers 140, reference block 160, and one or more sense amplifiers 150.

Memory array 130 includes one or more differential latch based OTP memory cells 105. Differential latch based OTP memory cells 105 are described in further detail in Section 2 below. When multiple OTP memory cells 105 are present in memory array 130, the OTP memory cells 105 may be arranged in a plurality of rows 132 and columns 134 forming an array. In this arrangement, memory array 130 comprises a total of "n" rows and "m" columns, where m may be greater than, equal to or less than n. A column of memory cells shares a single bit line. A row 132 of memory cells may also share a common row select line.

Address decoder and control block 170 is configured to control internal signals of memory block 100. Address decoder and control sub-block 170 receives an address or range of addresses and optionally a requested operation (e.g., program, read, or verify). The address or addresses may be received from an external source. The input address signals identify the memory cell or cells to be programmed, read, or verified.

Row decoder 180 is coupled to memory array 130 and address decoder and control block 170. Row decoder 180 is configured to select one row at a time from memory array 130. Row decoder 180 receives a control signal from address decoder and control block 160. The control signal indicates the mode of operation (e.g., program, read, or verify) and the address or range of addresses to be selected. A row is selected by raising its row select line to a voltage high level (e.g., 5V).

Program column select 120 is configured to select one or more bit lines during programming operation. Program column select 120 is optional. Program column select 120 receives a control signal from address decoder and control block. The control signal includes the mode of operation (e.g., program) and the address or range of addresses of the cells to be programmed. Program column select 120 selects a column by raising its bit line to a high voltage level (e.g., 5V). Program column select 120 allows for a single cell or group of cells to be programmed. When not present, all columns are selected during a program operation. By selecting a single column at a time, the size of the charge pump required for the memory block 400 can be reduced.

Charge pump 110 is optional. When present, charge pump 110 generates a high voltage supply (approximately 5V) from a lower core voltage supply (e.g., 1.0V or 2.0V) for programming the memory cells. When not present, the high voltage is provided by an external supply. In an embodiment, charge pump 110 is coupled to one or more bit lines associated with columns in memory array 130 by program column select 120.

Memory block 100 includes one or more sense amplifiers 150. The number of sense amplifiers is dependent upon the implementation of the memory block. The number of sense amplifiers may be equal to or less than the number of columns in memory array 130. At least one sense amplifier 150 is needed to operate the system. In an embodiment, if there are sixteen columns of memory cells present in array 130, there can be a sense amplifier 150 coupled to each of the sixteen columns in array 130. In other words, because there are sixteen sense amplifiers 150, sixteen memory cells in the row can be read at one time.

Column multiplexer 140 is configured to select the bit lines to be coupled to sense amplifiers 150. Column multiplexer 140 is optional. When present, column multiplexer 140 couples the bit lines for selected columns to sense amplifiers 150. Column multiplexer 140 allows for variable aspect ratios of the memory block, increasing the ease of floor planning at the chip level and improving performance of the memory block. For example, if memory block 100 has 16 output channels and 16 sense amplifiers 150, memory array 130 could be designed with 32 physical columns multiplexed to the 16 sense amplifiers via column multiplexer 140.

A sense amplifier 150 is coupled to reference block 160 and memory array 130. Each sense amplifier 150 is configured to sense the voltage of a bit line and compare the sensed voltage to a reference voltage provided by voltage reference generator 164. Sense amplifier 150 determines a state (e.g., programmed or unprogrammed) of the activated or enabled memory cell in array 130.

Reference block 160 includes a current reference generator 162 and a voltage reference generator 164. Current reference generator 162 provides a current to memory array 130 during verification mode. Voltage reference generator 164 provides a reference voltage to sense amplifiers 150. The reference voltage is designed to mimic the fuse device resistance.

2. Differential Latch Based One Time Programmable Memory Cell

Figure 2:
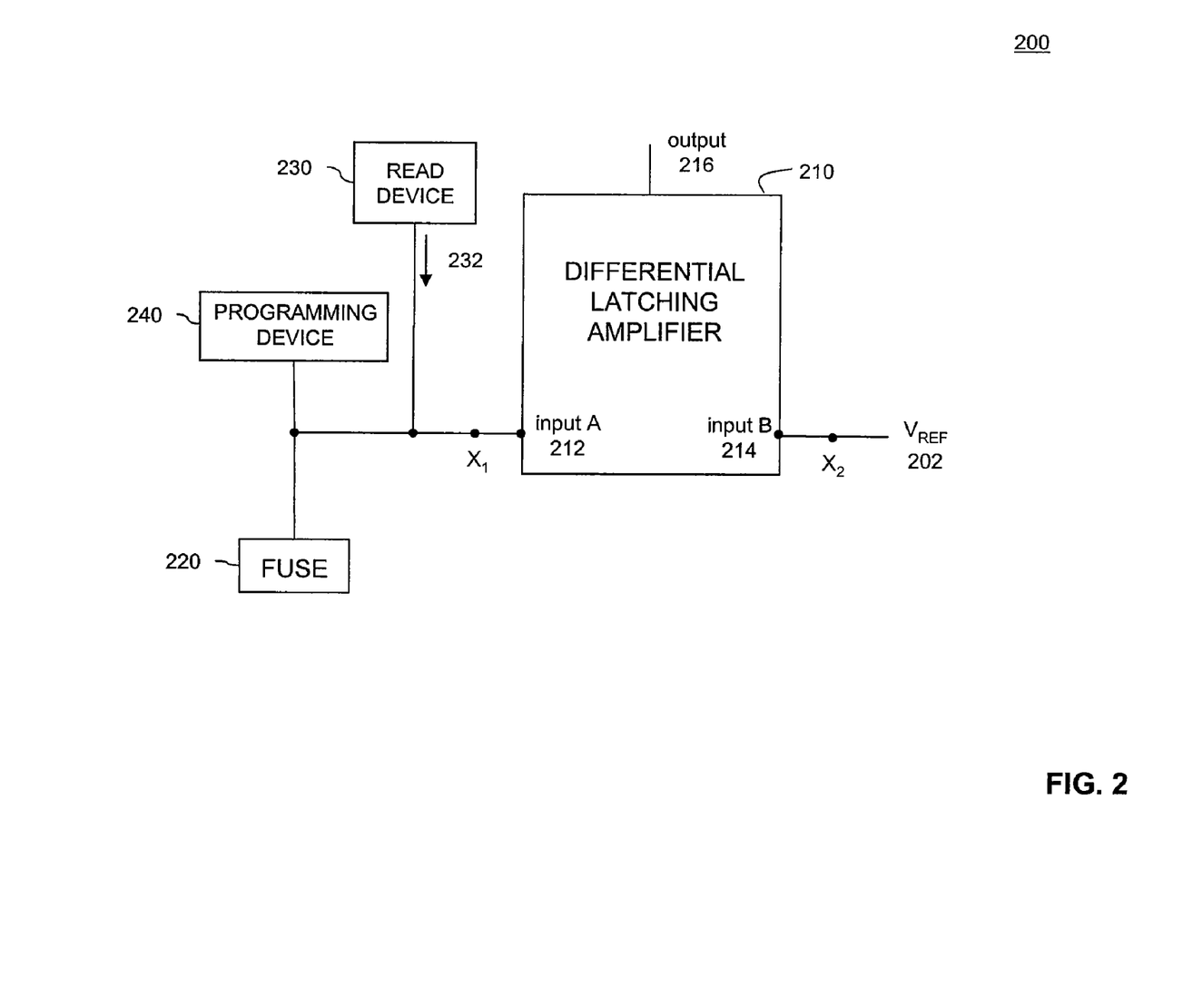
FIG. 2 depicts a block diagram of an existing single-ended latch-based OTP memory cell used in non-volatile memory arrays.

FIG. 2 depicts a block diagram of an existing single-ended latch-based OTP memory cell 200 used in non-volatile memory arrays. Single-ended latch-based OTP memory cell 200 includes a differential latching amplifier 210, a fuse 220, a read device 230, and a programming device 240. Differential latching amplifier 210 has a first input A 212, a second input B 214, and an output 216. Output 216 of differential latching amplifier 210 provides the state of the memory cell (i.e., programmed or unprogrammed). Read device 230 provides a reference current for reading fuse 220. Programming device 240 provides a programming current for programming fuse 220.

Fuse 220 may be comprised of a thin gate oxide transistor. An unprogrammed thin gate oxide fuse device has a high resistance. A programmed thin gate oxide fuse device (commonly referred to as a "blown" fuse) has a low resistance. The state assigned to a programmed fuse may be determined by a specific application or implementation. For example, in an application, a programmed fuse (low resistance) may be assigned to a logic zero state and an unprogrammed fuse (high resistance) may be assigned to a logic one state. Alternatively, a programmed fuse may be assigned to a logic one state and an unprogrammed fuse may be assigned to a logic zero state.

In differential latch based OTP cell 200, input A of the differential latching amplifier 210 is coupled to fuse 220. Input B of the differential latching amplifier 210 is coupled to a reference voltage, $V_{REF}$ 202. The reference voltage 202 is set to a percentage of the supply voltage level ($V_{DD}$). For example, in a typical embodiment, the reference voltage is set to 70% of the supply voltage.

During a read operation, reading device 230 supplies a read reference current 232. If fuse 220 is unprogrammed (i.e., has a high resistance), the current source drives the voltage on fuse 220 and the voltage level at input A 212 (e.g., node $X_1$ 292) to the supply voltage $V_{DD}$. When the voltage level of node $X_1$ (input A) is above the voltage level of node $X_2$ (input B), differential latching amplifier 210 outputs a first value (e.g., 0). If the fuse is programmed (i.e., creating a resistive short), the fuse sinks the read current and the voltage level at input A (node $X_1$ 292) goes to ground, $V_{SS}$. When the voltage level of node $X_1$ (input A) falls below the voltage level of node $X_2$ (input B), the differential latching amplifier 210 outputs a second value (e.g., 1).

In the read operation, the resistive short of the programmed fuse must have a low enough resistance to drive the voltage at node $X_1$ below the voltage level of node $X_2$. For example, if the reference voltage at $X_2$ is 70% of the supply voltage, node $X_1$ would have to be less than 70% of the supply voltage to cause OTP to be read as programmed.

Figure 3:
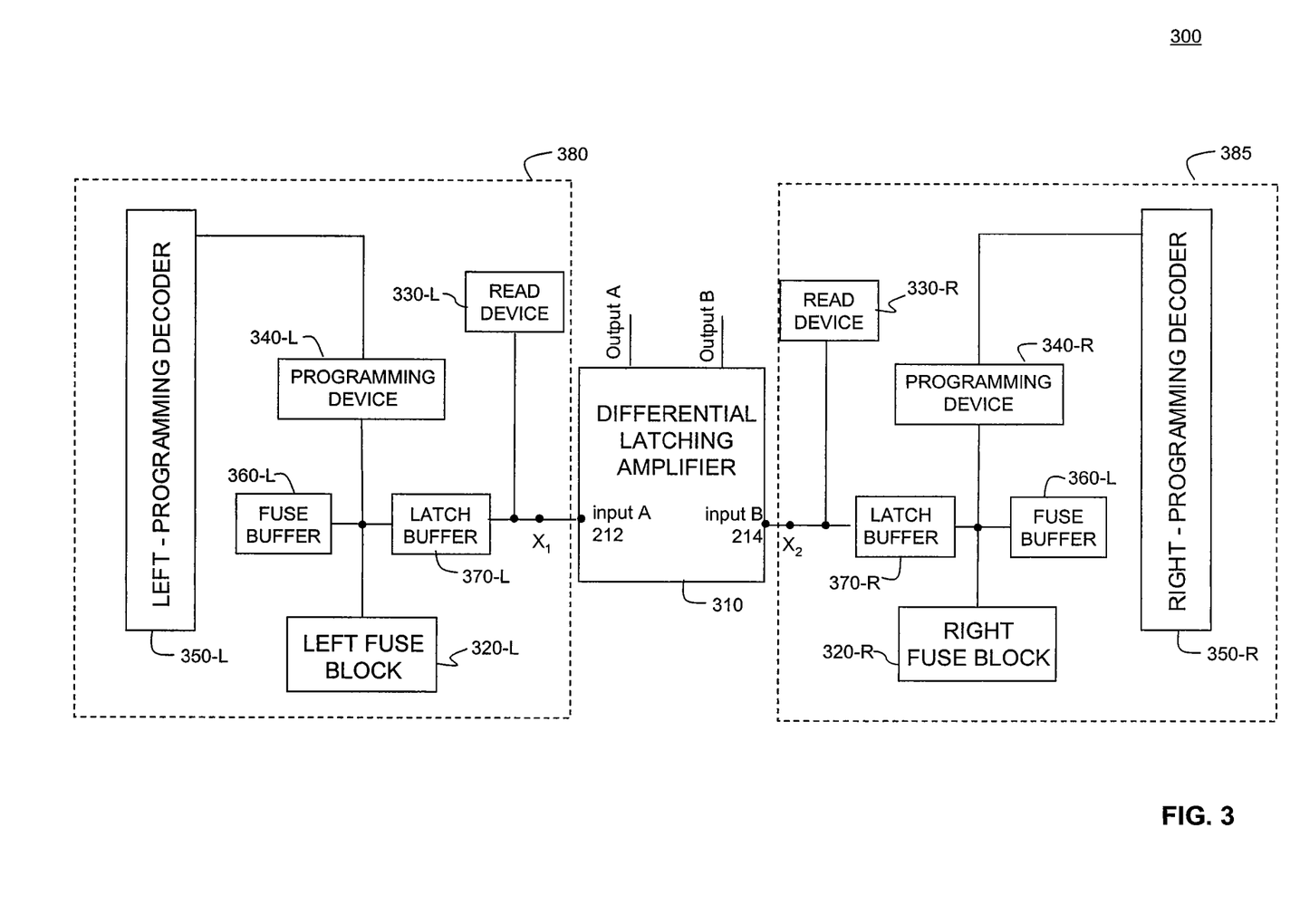
FIG. 3 depicts a high-level block diagram of a differential latch based OTP memory cell, according to embodiments of the present invention.

FIG. 3 depicts a high-level block diagram of a differential latch based OTP memory cell 300, according to embodiments of the present invention. OTP memory cell 300 includes a differential latching amplifier 310, a left side structure 380, and a right side structure 385. Right side structure 380 is symmetric with left side structure 385.

Left side structure 380 includes a read device 330-L, a programming decoder 350-L, a programming device 340-L, an optional fuse buffer 360-L, a latch buffer 370-L, and a fuse block 320-L. Right fuse structure 385 includes a read device 330-R, a programming decoder 350-R, a programming device 340-R, an optional fuse buffer 360-R, a latch buffer 370-R, and a fuse block 320-R.

Fuse block 320-L, 320-R includes one or more fuses. As would be appreciated by persons of skill in the art, fuse block 320-L, 320-R may also include one or more antifuses. Left and right programming decoders 350-L and 350-R enable the programming of fuses in the left and right fuse blocks.

Programming device 340-L, 340-R provides programming current and voltage to its respective fuse block 320-L, 320-R. Read device 330-L, 330-R provides a read reference current to its respective fuse block 320-L, 320-R. Fuse buffer 360-L, 360-R protects the one or more fuses 320-L, 320-R when the fuses are not being programmed or read. Latch buffer 370-L, 370-R isolates its associated memory cell side from differential latching amplifier 310 when the fuses are not selected for programming or reading. Embodiments of the above memory cell elements are described in further detail in FIG. 4, below.

As illustrated in FIG. 3, the reference voltage at input B 294 of the single-ended latch-based memory cell of FIG. 2 is replaced with a second fuse block. In FIG. 3, the comparison being performed by the differential latching amplifier 310 is differential rather than single-ended as in the single-ended OTP structure depicted in FIG. 2. This differential comparison increases the read margin and consequently the yield and manufacturability of the differential latch-based OTP memory cell 300.

Figure 4:
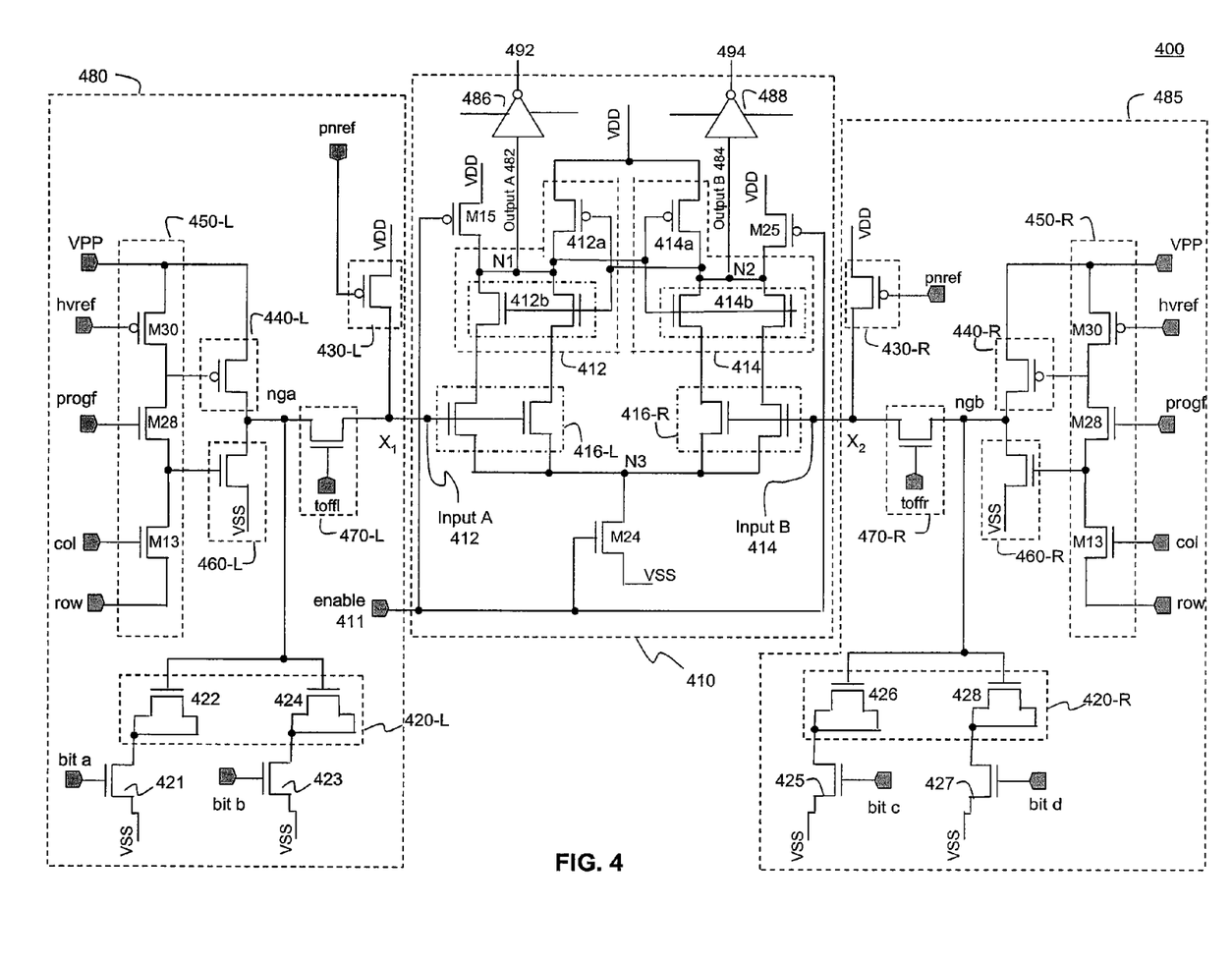
FIG. 4 depicts an exemplary differential latch-based OTP memory cell, according to embodiments of the present invention.

FIG. 4 depicts an exemplary differential latch-based OTP memory cell 400, according to embodiments of the present invention. OTP memory cell 400 includes a differential latching amplifier 410, a left side structure 480, and a symmetric right side structure 485. As described above in FIG. 3, each side structure 480, 485 includes a read device 430-L, 430-R, a programming decoder 450-L, 450-R, a programming device 440-L, 440-R, an optional fuse buffer 460-L, 460-R, a latch buffer 470-L, 470-R, and a fuse block 420-L, 420-R.

A fuse block 420-L, 420-R includes one or more fuses. For example, left fuse block 420-L includes a first fuse 422 and a second fuse 424 and right fuse block 420-R includes a first fuse 426 and a second fuse 428. Fuses 422-428 may be single transistor or two transistor (2T) fuses. Fuses 422-428 may be a single NMOS gate of NMOS, native NMOS transistor, an NMOS transistor with a native $V_T$ implant, or an NMOS transistor in $N_{WELL}$. Alternatively, one or more of fuses 422-428 may be PMOS with a current source to ground for comparison. A 2T fuse can be full gate or half gate of NMOS or Native NMOS. Fuse 424 in the left fuse block and fuse 428 in the right fuse block are provided for redundancy. One or both fuses in right side fuse structure 420-R and one or both fuses in left side fuse structure 420-L can be programmed. The decision on whether to program one or both fuses on a side is a function of the desired yield and reliability.

To program a first state (e.g., a "0"), either fuse 422 or fuse 424 or both in left fuse block 420-L are programmed. To program the opposite state (e.g., a "1"), either fuse 426 or fuse 428 or both in right fuse block 420-R are programmed. Programming all four fuses, programming fuse 422 and fuse 426, and programming fuse 424 and fuse 428 produces indeterminate results. Therefore, only one of the pair of fuses or both of the pair of fuses on one side of the OTP structure are programmed.

A fuse block 420-L, 420-R may also include optional fuse selection devices to enable the fuses in the block to be programmed individually. In an embodiment, fuse selection devices are NMOS transistors. In this embodiment, fuse block 420-L includes a first fuse selection transistor 421 coupled at its gate to a fuse select line (bit a), at its source to ground ($V_{SS}$), and at its drain to fuse 422. Second fuse selection transistor 423 is coupled at its gate to a fuse select line (bit b), at its source to ground ($V_{SS}$), and at its drain to fuse 424. Similarly, fuse block 420-R includes a first fuse selection transistor 425 coupled at its gate to a fuse select line (bit c), at its source to ground ($V_{SS}$), and at its drain to fuse 426. Second fuse selection transistor 427 is coupled at its gate to a fuse select line (bit d), at its source to ground ($V_{SS}$), and at its drain to fuse 428. To select a fuse, the fuse select line for its associated select transistor is raised to high, causing the fuse to be coupled to ground ($V_{SS}$).

In an alternative embodiment, one or both fuse blocks 420-L, 420-R do not include fuse select devices. In this embodiment, the fuses in the fuse block 420 cannot be individually selected and are therefore programmed together.

Programming decoder 450-L, 450-R enables the programming of the fuses. Programming decoder 450-L, 450-R includes transistors M30, M28, and M13. In an embodiment, transistor M30 is a PMOS transistor and transistors M28 and M13 are NMOS transistors. The gate of transistor M30 is coupled to a reference voltage input for the decoder (hvref), the drain of transistor M30 is coupled to the programming voltage ($V_{PP}$), and the source of transistor M30 is coupled to the drain of transistor M28. The gate of transistor M28 is tied to a fuse programming input (progf), the drain of transistor M28 is coupled to the source of transistor M30, and the source of transistor M28 is coupled to fuse buffer 460-L and to the drain of transistor M13. The gate of transistor M13 is tied to a column select line (col), the source of transistor M13 is tied to a row select line (row), and the drain of transistor M13 is coupled to fuse buffer 460-L and the source of transistor M28. When OTP memory cell 400 is selected for programming the inputs of the programming decoder 450-L, 450-R (col, row, hvref, and progf) are set such that the voltage level at the gate of the programming device 440-L, 440-R is ground ($V_{SS}$).

Programming device 440-L, 440-R provides the programming current and voltage to its associated fuse block 420 during programming operation and also couples or decouples fuses in the fuse block 420 from the programming supply voltage ($V_{PP}$). Programming device 440-L, 440-R includes a transistor M29 coupled at its gate to programming decoder 450, at its source to fuse block 420, and at its drain to the programming voltage $V_{PP}$. In an embodiment, transistor M29 is a PMOS transistor. When programming decoder 450 presents a voltage level of ground ($V_{SS}$) at the gate of transistor M29, transistor M29 conducts.

Fuse buffer 460-L, 460-R protects the fuses when the fuses are not being programmed or read. Fuse buffer 460-L, 460-R are optional. Fuse buffer 460-L, 460-R includes a transistor M16 coupled at its gate to programming decoder 450, at its source to ground, and at its drain to node nga/ngb. In an embodiment, fuse buffer 460-L, 460-R is a NMOS transistor. When activated, fuse buffer 460-L, 460-R sinks current, causing the nga/ngb node to go to ground. This prevents stress on fuses when the OTP memory cell is not selected for programming or reading.

Latch buffer 470-L, 470-R protects the differential latching amplifier 410 when the fuses are being programmed. Latch buffer 470-L, 470-R are optional.

In an embodiment, latch buffer 470-L includes a transistor coupled at its gate to a toff-l signal, at its source to differential latching amplifier 410, and at its drain to node nga. Latch buffer 470-R includes a transistor coupled at its gate to a toff-r signal, at its source to differential latching amplifier 410, and at its drain to node ngb. In an embodiment, latch buffers 470-L, 470-R are NMOS transistors.

When one or more fuses in fuse block 420-L are being programmed, toff-l is set to ground, isolating the differential latching amplifier 410 from the left side fuse block 420-L. When one or more fuses in fuse block 420-R are being programmed, toff-r is set to ground, isolating the differential latching amplifier 410 from the right side fuse block 420-R. When OTP memory is being read, both toff-l and toff-r are set to high to couple the left and right fuse blocks 420-L, 420-R to differential latching amplifier 410.

Read device 430-L, 430-R provides read reference current for its respective side. Read device 430 is a transistor coupled at its gate to a reference signal (pnref), at its source to supply voltage VDD, and at its drain to differential latching amplifier 410, and latch buffer 470. In an embodiment, read device 430 is a PMOS transistor.

Differential latching amplifier 410 is configured to latch the state of the OTP memory cell 400. Differential latching amplifier 410 has two inputs, input A 412 and input B 414 and two outputs, output A 482 and output B 484. Output A is fed as input into a left output inverter 486 and output B is fed as input into a right output inverter 488. Inverters 486 and 488 are configured to drive the output signals (492, 494) from memory cell 400. The use of two inverters provides balance and reduces mismatch.

Differential latching amplifier 410 includes a first inverter 412, a second inverter 414, a left input gate 416-L, and a right input gate 416-R. Differential latching amplifier 410 also includes latch enable transistors M24, M15 and M25. Differential latching amplifier 410 may optionally include a left output inverter 486 and a right output inverter 488.

First inverter 412 includes a PMOS transistor 412a (M18) and a NMOS transistor 412b. NMOS transistor 412b is depicted as two NMOS transistors M14 and M19. This split configuration improves matching. As would be appreciated by persons of skill in the art, a single NMOS transistor could be used in inverter 412. Second inverter 414 includes a PMOS transistor 414a (M20) and a NMOS transistor 414b. NMOS transistor 412b is also depicted as two NMOS transistors M21 and M26. As would be appreciated by persons of skill in the art, a single NMOS transistor could be used in inverter 414.

First inverter 412 and second inverter 414 are cross-coupled. The output of first inverter 412 is coupled to the input of second inverter 414 and the output of the second inverter 414 is coupled to the input of first inverter 412. The gate of PMOS transistor 412a is coupled to the gate of NMOS transistor 412b, to the drain of NMOS transistor 414b, and to the drain of PMOS transistor 412a. The drain of PMOS transistor 412a is coupled to left output inverter 486, the drain of latch enable transistor M15, and to the gate of PMOS transistor 414a. The source of PMOS transistor 412a is coupled to the supply voltage ($V_{DD}$). Similarly, the gate of PMOS transistor 414a is coupled to the gate of NMOS transistor 414b, to the drain of NMOS transistor 412b, and to the drain of PMOS transistor 412a. The drain of PMOS transistor 414a is coupled to the right output inverter 488, the drain of latch enable transistor M25, and to the gate of PMOS transistor 412a. The source of PMOS transistor 414a is coupled to the supply voltage $V_{DD}$.

Left input transistor 416-L and right input transistor 416-R are depicted as two NMOS transistors. As described above, this split configuration improves matching. As would be appreciated by persons of skill in the art, a single NMOS transistor could be used as the left or right input transistor 416-L, 416-R. In an embodiment, left input transistor 416-L and right input transistor 416-R are thin oxide transistors. Alternatively, left and right input transistors 416-L, 416-R are thick oxide transistors. Left input transistor 416-L is coupled at its gate to latch buffer 470-L, at its drain to the source of NMOS transistor 412b, and at its source to latch enable transistor M24 and to the source of right input transistor 416-R. Right input transistor 416-R is coupled at its gate to latch buffer 470-R, at its drain to the source of NMOS transistor 414b, and at its source to latch enable transistor M24 and to the source of left input transistor 416-L. The level of the voltage at the gate of the left input transistor 416-L (e.g., at node $X_1$) versus the level of the voltage at the gate of the right input transistor 416-R (e.g., at node $X_2$) determines if the cell is going to be latched to a data value "1" or a data value "0."

Latch enable transistors M24, M15, and M25 are configured to cause the differential latching amplifier 410 to latch the state of the OTP memory cell. In an embodiment, latch enable transistor M24 is an NMOS transistor and latch enable transistors M15 and M25 are PMOS transistors. The gate of each of the latch enable transistors M24, M15, and M25 is coupled to an enable line 411. The drain of NMOS latch enable transistor M24 is coupled to the source of left input transistor 416-L and to the source of right input transistor 416-R; the source of latch enable transistor M24 is coupled to ground ($V_{SS}$). The source of PMOS latch enable transistor M15 is coupled to the supply voltage ($V_{DD}$) and the drain of PMOS latch enable transistor M15 is coupled to left output inverter 486, to the drain of first inverter NMOS transistor 412b, and to the gate of second inverter PMOS transistor 414a. The source of PMOS latch enable transistor M25 is coupled to the supply voltage ($V_{DD}$) and the drain of PMOS latch enable transistor M25 is coupled to right output inverter 488, to the drain of second inverter NMOS transistor 414b, and to the gate of first inverter PMOS transistor 412a. To cause latching amplifier 410 to latch the state of OTP memory cell, an enable signal having a HIGH value is applied to enable line 411. When a HIGH voltage level is received on enable line 411, NMOS latch transistor M24 conducts, coupling the sources of the left and right input transistors 416-L, 416-R to ground $V_{SS}$. PMOS latch transistors M15 and M25 stop conducting, disconnecting the supply voltage from nodes N1 and N2.

As would be appreciated by persons of skill in the art, the differential latching amplifier 410 illustrated in FIG. 4 is an exemplary configuration and other configurations can be used with the present invention.

3. System Operation 3.1 Program Mode

Program mode is used to program one or more memory cells in a memory array such as memory array 130 depicted in FIG. 1. As described in Section 2, during program mode, one or more fuses in a fuse block in an OTP memory cell 400 may be selected for programming.

Figure 5:
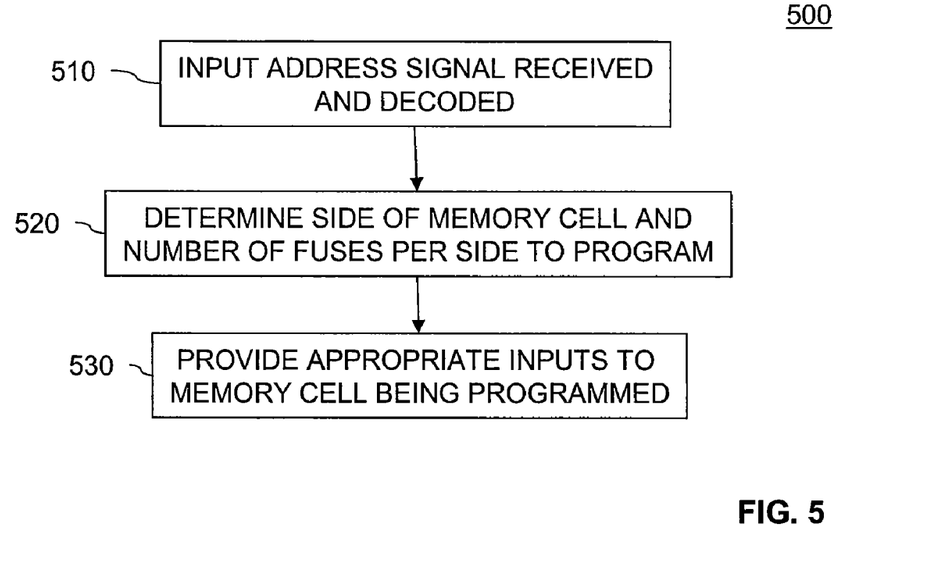
FIG. 5 depicts a flowchart of an exemplary method for programming a differential latch-based memory cell, according to embodiments of the present invention.

FIG. 5 depicts a flowchart 500 of an exemplary method for programming a differential latch-based memory cell, according to embodiments of the present invention. Flowchart 500 is described with continued reference to the exemplary embodiments illustrated in FIGS. 1 and 4. However, flowchart 500 is not limited to those embodiments. Note that the steps of flowchart 500 do not necessarily have to occur in the order shown.

In step 510, an input address to be programmed is received by memory device 100 and decoded by address decode and control block 170, row decoder 180, and/or program column select block 120. As part of the decoding process, the row containing the memory cell to be programmed and the column containing the memory cell to be programmed are identified.

In step 520, the side of the memory cell (e.g., left versus right) to be programmed and the number of fuses to program per side is determined. The side of the memory cell to be programmed is selected based on the value to be programmed into the memory cell. Programming one or more fuses on the left side 480 of a memory cell 400 indicates a first value (e.g., "0") and programming one or more fuses on the right side 485 of the memory cell 400 indicates the opposite value (e.g., "1"). The number of fuses to program per side is application specific. For example, in an application requiring greater redundancy, both fuses in a fuse block 420 may be programmed.

In step 530, the appropriate programming inputs are provided to the memory cell being programmed. The memory cell being programmed receives a number of inputs required to cause the memory cell to be properly programmed. The first set of inputs includes the fuse select signals. The fuse select signals are used to turn "on" or "off" fuse selection transistors 421, 423, 425, and 427. For example, if fuses 422 and 424 in left fuse block 420 are to be programmed, fuse select signals having a HIGH value are received on the fuse select lines for fuse selection transistors 421 and 423 (i.e., bit a and bit b). The remaining fuse select signals are set to a LOW value (i.e., bit c and bit d). This causes fuses 422 and 424 to be coupled to ground.

A second set of input signals includes signals to set latch buffers 470-L and 470-R. When one or more fuses in left fuse block 420-L are being programmed, the input signal to latch buffer 470-L (toff-l) is set to LOW, isolating the differential latching amplifier 410 from the left side fuse block 420-L. When one or more fuses in right fuse block 420-R are being programmed, the input signal to latch buffer 470-R (toff-r) is set to LOW, isolating the differential latching amplifier 410 from the right side fuse block 420-R.

A final set of input signals includes inputs to left programming decoder 450-L and right programming decoder 450-R. The set of decoding inputs includes the column and row select signals, a decoder reference voltage (pnref), and a programming input (progf). The set of decoding inputs is configured to cause programming device 440-L or 440-R to apply the programming voltage ($V_{PP}$) and programming current to its associated fuse block 420. Because the source of a selected fuse in a fuse block is tied to ground, the selected fuse sees a high voltage between its gate and source. The voltage is sufficient to break down the thin gate oxide of the fuse (e.g., a voltage in the 3-5V range). When the oxide is broken down, a conductive path is formed between the gate and the source/drain regions of the transistor, programming the fuse.

3.2 Read Mode

Read mode is used to read the content of a set of memory cells in a memory array. This operation is typically, but not necessarily exclusively, performed after the OTP element memory core 105 has been programmed and verified.

Figure 6:
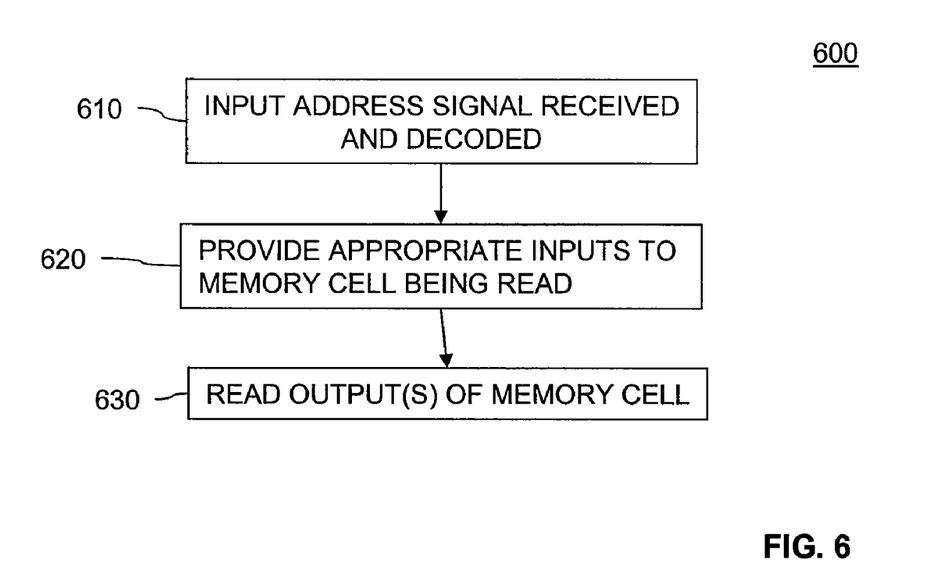
FIG. 6 depicts a flowchart of an exemplary method for reading a differential latch-based memory cell, according to embodiments of the present invention.

FIG. 6 depicts a flowchart 600 of an exemplary method for reading a differential latch-based memory cell, according to embodiments of the present invention. Flowchart 600 is described with continued reference to the embodiments illustrated in FIGS. 1 and 4. However, flowchart 600 is not limited to those embodiments. Note that the steps of flowchart 600 do not necessarily have to occur in the order shown.

In step 610, an input address to be read is received by memory device 100 and decoded by address decode and control block 170, row decoder 180, and/or program column select 120. As part of the decoding process, the row containing the memory cell to be read and the column containing the memory cell to be read are identified.

In step 620, the appropriate read inputs are provided to the memory cell being read. The memory cell being read receives a number of inputs required to cause the memory cell to be properly read. The first set of inputs includes the fuse select signals. The fuse select signals are used to turn "on" each fuse selection transistors 421, 423, 425, and 427. Therefore, a fuse select signal having a HIGH value is provided to each fuse selection transistor (e.g., bit a, bit b, bit c, and bit d).

A second set of inputs includes the latch enable signal 411. The latch enable signal causes the differential latching amplifier 410 to latch the data value programmed into the memory cell. For example, when latch enable signal 411 has a HIGH value, latch enable transistor M24 conducts, coupling the source of the left input transistor 416-L and the source of the right input transistor 416-R to ground $V_{SS}$. Simultaneously, latch enable transistors M15 and M25 stop conducting. When latch enable signal 411 has a LOW value, latch enable transistors M15 and M25 conduct, coupling the supply voltage $V_{DD}$ to node N1 and N2 and latch enable transistor M24 stops conducting, causing N3 to float.

A third set of inputs includes the input to read device 430-L and read device 430-R (pnref). The read reference input (pnref) causes read device 430-L, 430-R to supply a read current to its associated fuse blocks 420-L and 420-R.

For example, if both fuses in fuse block 420-L are unprogrammed (i.e., have a high resistance), the read current source drives the voltage on the fuses and the voltage level node $X_1$ to the supply voltage ($V_{DD}$). If one or both fuses is programmed (i.e., creating a resistive short), the programmed fuse (or fuses) sinks the read current and the voltage level of node $X_1$ goes to ground ($V_{SS}$).

In step 630, the outputs of the differential latching amplifier 410 are read. As described above, differential latching amplifier 410 has a first output 496 and a second output 498. The values of output 496 and 498 determine whether the cell has been programmed, and if the cell has been programmed, the data value associated with the cell. If neither fuse block 420-L, 420-R is programmed, the differential latching amplifier 410 sees the same differential input at input A and input B. As a result, the output is indeterminable (either "1" or "0"). If one fuse block is programmed, the side having the programmed fuse will present a lower voltage at its input to the differential latching amplifier 410. Amplifier 410 will then output a "0" or a "1" depending on the side having the programmed fuse.

For example, if one or both fuses in the left fuse block 420-L are programmed, during read operation, node $X_1$ goes to ground. In this example, both fuses in the right fuse block 420-R are left unprogrammed. Therefore, node $X_2$ is driven to the supply voltage $V_{DD}$. When latching amplifier 410 is enabled, left output inverter 486 outputs a "0" as output A 496 and right output inverter 488 outputs a "1" as output B 498. Alternatively, if one or both fuses in the right fuse block 420-R are programmed, left output inverter 486 outputs a "1" as output A 496 and right output inverter 488 outputs a "0" as output B 498. If neither side is programmed, the output is indeterminate.

As illustrated in the diagram of FIG. 4 and the flowchart of FIG. 6, differential latch-based OTP memory cell 400 is symmetric. Node $X_2$ is no longer set a percentage of the supply voltage, as in prior latch-based OTP memory cells. Instead, node $X_2$ is at the supply voltage. If the prior latch-based OTP memory cell used a reference voltage of 70% of the supply voltage, the differential latch-based OTP memory cell described herein (having approximately 100% of supply voltage at input B during read operation) increases read margin by approximately 30% of $V_{DD}$.

4. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A one-time programmable memory cell, comprising:
 a differential latching amplifier having a first input and a second input;
 a first fuse device coupled to the first input of the differential latching amplifier; and
 a second fuse device coupled to the second input of the differential latching amplifier,
 wherein when the first fuse device is programmed, differential latching amplifier outputs a first value during a read operation, and when the second fuse device is programmed, differential latching amplifier outputs a second value during a read operation.

2. The one-time programmable memory cell of claim 1, wherein the fuse device is a thin-oxide MOS transistor.

3. The one-time programmable memory cell of claim 2, wherein the thin-oxide MOS transistor is an NMOS transistor.

4. The one-time programmable memory cell of claim 2, wherein the thin-oxide MOS transistor is an NMOS transistor with a native $V_T$ implant.

5. The one-time programmable memory cell of claim 2, wherein the thin-oxide MOS transistor is an NMOS transistor in $N_{WELL}$.

6. The one-time programmable memory cell of claim 2, wherein the thin-oxide MOS transistor is a PMOS transistor.

7. The one-time programmable memory cell of claim 1, further comprising:
a third fuse device coupled to the first input of the differential latching amplifier; and
a fourth fuse device coupled to the second input of the differential latching amplifier.

8. The one-time programmable memory cell of claim 1, further comprising:
a plurality of fuse devices coupled to the first input of the differential latching amplifier; and
a plurality of fuse devices coupled to the second input of the differential latching amplifier.

9. The one-time programmable memory cell of claim 7, further comprising:
a first fuse select transistor coupled to a first fuse select line and to the first fuse;
a second fuse select transistor coupled to a second fuse select line and to the second fuse;
a third fuse select transistor coupled to a third fuse select line and to the third fuse; and
a fourth fuse select transistor coupled to a fourth fuse select line and to the fourth fuse.

10. The one-time programmable memory cell of of claim 1, further comprising:
a first latch buffer transistor coupled at a gate to a first latch enable line, at a source to the first input of the differential latch amplifier, and at a drain to the first fuse; and
a second latch buffer transistor coupled at a gate to a second latch enable line, at a source to the second input of the differential latch amplifier, and at a drain to the second fuse.

11. The one-time programmable memory cell of claim 1, further comprising:
a first fuse buffer transistor coupled at a gate to a first program decoder, at a source to ground, and at a drain to the first fuse; and
a second fuse buffer transistor coupled at a gate to a second program decoder, at a source to ground, and at a drain to the second fuse.

12. The one-time programmable memory cell of claim 1, wherein when the first fuse is unprogrammed and the second fuse is unprogrammed, the differential latching outputs a random value.

13. The one-time programmable memory cell of claim 1, wherein the differential latching amplifier includes a first output and a second output.

14. The one-time programmable memory cell of claim 13, further comprising:
a first inverter coupled to the first output; and
a second inverter coupled to the second output.

15. A method for reading a one-time programmable memory cell having a differential latching amplifier coupled at a first input to a first fuse device and at a second input to a second fuse device, comprising:
providing a first read current to the first fuse device;
providing a second read current to the second fuse device,
outputting a first value when the first fuse device is programmed causing the voltage level at the first input of the differential amplifier is lower than a voltage level at the second input of the differential amplifier; and
outputting a second value when the second fuse device is programmed causing the voltage level at the first input of the differential amplifier is higher than the voltage level at the second input of the differential amplifier.

16. A one-time programmable memory device, comprising:
a plurality of one-time programmable memory cells arranged in a memory array, wherein a one-time programmable memory cell includes:
a differential latching amplifier having a first input and a second input,
a first fuse device coupled to the first input of the differential latching amplifier, and
a second fuse device coupled to the second input of the differential latching amplifier,
wherein when the first fuse device is programmed, differential latching amplifier outputs a first value during a read operation, and when the second fuse device is programmed, differential latching amplifier outputs a second value during a read operation.

17. The one-time programmable memory device of claim 16, wherein the fuse device is a thin-oxide MOS transistor.

18. The one-time programmable memory device of claim 17, wherein the thin-oxide MOS transistor is an NMOS transistor.

19. The one-time programmable memory device of claim 17, wherein the thin-oxide MOS transistor is an NMOS transistor with a native $V_T$ implant.

20. The one-time programmable memory device of claim 17, wherein the thin-oxide MOS transistor is an NMOS transistor in NWELL.

21. The one-time programmable memory device of claim 17, wherein the thin-oxide MOS transistor is a PMOS transistor.

* * * * *